(12) United States Patent
Hsieh et al.

(10) Patent No.: US 11,373,702 B2
(45) Date of Patent: Jun. 28, 2022

(54) BOOST SCHEMES FOR WRITE ASSIST

(71) Applicant: Taiwan Semiconductor Manufacturing Company, Ltd., Hsinchu (TW)

(72) Inventors: Wei-Jer Hsieh, Hsinchu (TW); Chiting Cheng, Taichung (TW); Yangsyu Lin, New Taipei (TW); Shang-Chi Wu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/662,433

(22) Filed: Oct. 24, 2019

(65) Prior Publication Data
US 2020/0135269 A1 Apr. 30, 2020

Related U.S. Application Data

(60) Provisional application No. 62/753,760, filed on Oct. 31, 2018.

(51) Int. Cl.
*G11C 11/41* (2006.01)
*G11C 11/419* (2006.01)
*G11C 7/12* (2006.01)
*G11C 11/408* (2006.01)
*G11C 11/4096* (2006.01)
(Continued)

(52) U.S. Cl.
CPC ............. *G11C 11/419* (2013.01); *G11C 7/12* (2013.01); *G11C 8/08* (2013.01); *G11C 11/4085* (2013.01); *G11C 11/4096* (2013.01); *H01L 23/5223* (2013.01)

(58) Field of Classification Search
CPC .......... G11C 7/12; G11C 11/417; G11C 8/06; G11C 11/4085; G11C 8/08; G11C 11/4096; G11C 11/419; H01L 23/5223
See application file for complete search history.

(56) References Cited

U.S. PATENT DOCUMENTS 6,928,873 B2 * 8/2005 Chen ................. G01C 19/5719
73/504.04
8,022,458 B2 * 9/2011 Chang ............... H01L 27/11568
257/307
(Continued)

FOREIGN PATENT DOCUMENTS

CN 102057437 A 5/2011
CN 103229242 A 7/2013
(Continued)

*Primary Examiner* — Vanthu T Nguyen
(74) *Attorney, Agent, or Firm* — Merchant & Gould P.C.

(57) ABSTRACT

A write assist circuit is provided. The write assist circuit includes a transistor switch coupled between a bit line voltage node of a cell array and a ground node. An invertor is operative to receive a boost signal responsive to a write enable signal. An output of the invertor is coupled to a gate of the transistor switch. The write assist circuit further includes a capacitor having a first end coupled to the bit line voltage node and a second end coupled to the gate node. The capacitor is operative to drive a bit line voltage of the bit line voltage node to a negative value from the ground voltage in response to the boost signal.

20 Claims, 14 Drawing Sheets

(51) Int. Cl.
*H01L 23/522* (2006.01)
*G11C 8/08* (2006.01)

(56) References Cited

U.S. PATENT DOCUMENTS

| | | | | |
|---|---|---|---|---|
| 8,072,823 | B2* | 12/2011 | Aihara | H01L 27/0207 |
| | | | | 365/189.16 |
| 8,188,797 | B2* | 5/2012 | Moussavi | H03L 7/0995 |
| | | | | 331/36 C |
| 8,270,247 | B2* | 9/2012 | Sasaki | G11C 8/08 |
| | | | | 365/230.06 |
| 9,070,432 | B2 | 6/2015 | Hsieh et al. | |
| 9,424,912 | B2* | 8/2016 | Wu | G11C 7/12 |
| 10,431,295 | B2* | 10/2019 | Wang | G11C 11/417 |
| 2011/0032779 | A1 | 2/2011 | Aihara et al. | |
| 2011/0057293 | A1* | 3/2011 | Tsai | H01L 23/5223 |
| | | | | 257/532 |
| 2011/0133823 | A1 | 6/2011 | Kimura | |

FOREIGN PATENT DOCUMENTS

| | | |
|---|---|---|
| CN | 104637517 A | 5/2015 |
| CN | 105009216 A | 10/2015 |
| TW | 201110167 A | 3/2011 |

\* cited by examiner

BOOST SCHEMES FOR WRITE ASSIST

PRIORITY CLAIM AND CROSS-REFERENCE

This application claims priority to U.S. Provisional Patent Application No. 62/753,760 titled "BOOST SCHEMES FOR SRAM WRITE-ASSIST" filed Oct. 31, 2018, the disclosure of which is hereby incorporated by reference in its entirety.

BACKGROUND

A common type of integrated circuit memory is a static random access memory (SRAM) device. A typical SRAM memory device includes an array of bit cells, with each bit cell having six transistors connected between an upper reference potential and a lower reference potential. Each bit cell has two storage nodes where information may be stored. The first node stores the desired information, while the complementary information is stored at the second storage node. SRAM cells have the advantageous feature of holding data without requiring a refresh.

The lowest VDD voltage (positive power supply voltage) at which an SRAM bit cell may function is referred to as Vccmin. Having a low cell VDD near Vccmin reduces leakage current and also reduces the incidence of read flips. But having a high cell VDD improves the probability of successful write operations. Therefore, the Vccmin is limited by the write operation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
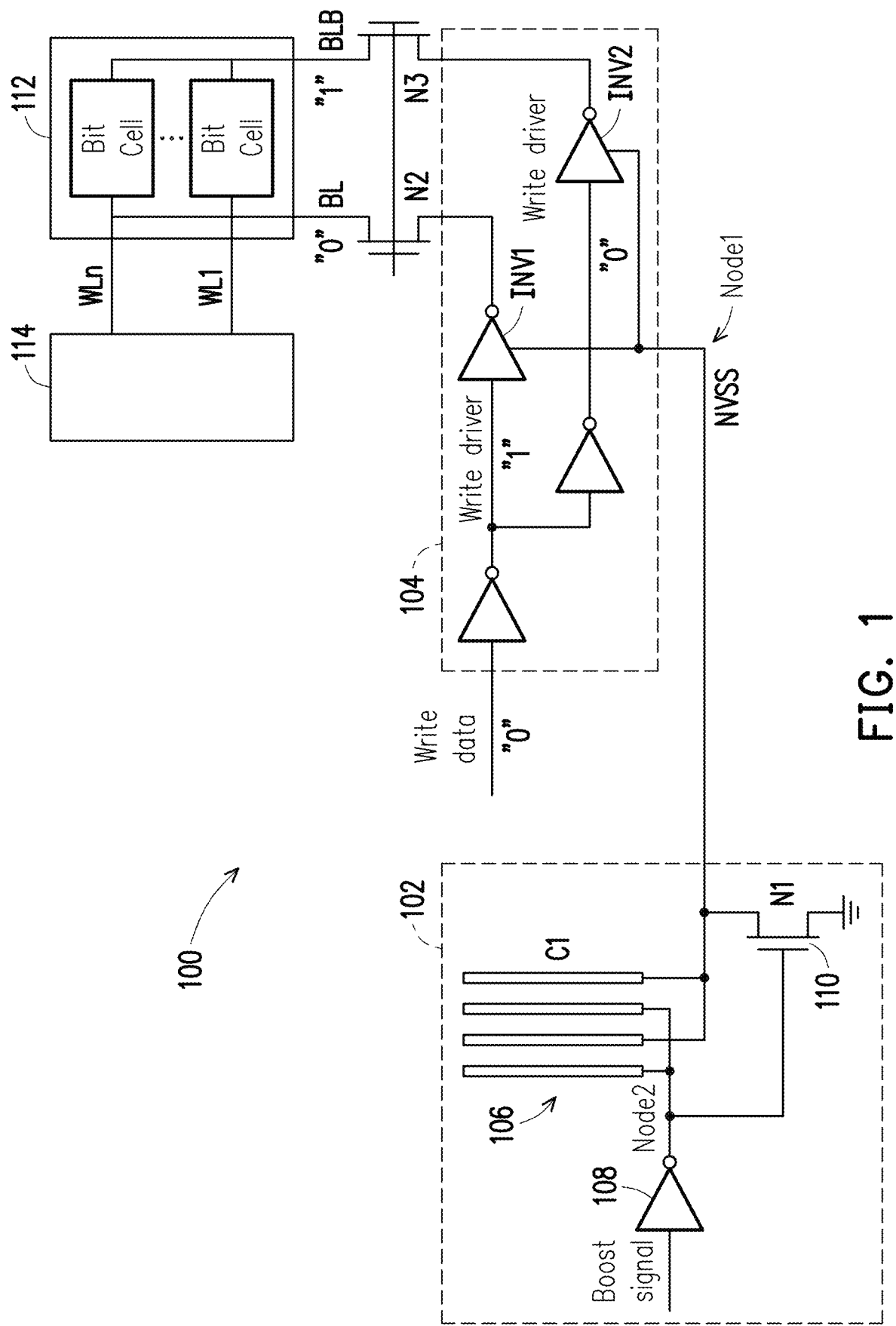
FIG. 1 is a schematic diagram of a device with a first boost circuit in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The disclosure provides boost circuits that enables a more balanced negative bit line voltage ("NVSS") across a plurality of memory cells connected to the bit line for optimizing write performance while minimizing the impact on transistor reliability. In addition, the disclosure provides boost circuits that enable a more balanced boost voltage ("BVDD") across a plurality of memory cells connected to a word line for optimizing write performance while minimizing the impact on transistor reliability. This is advantageous for a number of circuit on chip devices, as well as other circuits, including for example SRAM memory arrays. Embodiments constructed in accordance with the principles of the present invention provide improved write assist.

FIG. 1 illustrates a device 100 having a first boost circuit, in accordance with some embodiments. Device 100 may be a circuit having a memory device, such as a SRAM device. Device 100 includes a first boost circuit (also referred to as a bit line boost circuit 102) coupled to a write driver circuit 104. Device 100 further includes a cell array 112 and a word line driver circuit 114. Cell array 112 includes a plurality of bit cells arranged in matrix of plurality of rows and columns. Each of the plurality of rows include a first plurality of bit cells and each of the plurality of columns include a second plurality of bit cells. Each of the first plurality of bit cells of each of the plurality of rows are connected to one of a plurality of word lines and each of the second plurality of bit cells of each of the plurality of columns are connected to a pair of bit lines (that is a bit line and an inverse bit line (BL/BLB)). Each bit cell of cell array 112 is configured as a pair of cross-coupled invertors that operate to reinforce the data state stored therein, i.e., the true data node reinforces the complementary data node and vice versa. That is, each bit cell of cell array 112 is configured to store one bit of information (that is, bit value of 0 or 1).

Word line driver circuit 114 is operative to select one of the plurality of word lines (that is WL1, . . . , WLn) and charge the selected word line to a predetermined voltage. Write driver circuit 104 is operative to write one bit of information to bit cells connected to the selected one of the plurality of word lines. Write driver circuit 104 includes a first invertor (INV1) coupled to a bit line (BL) through a write column multiplexer selection transistor (N2) and a second invertor (INV2) coupled to the inverse bit line (BLB) through a write column multiplexer transistor (N3). The illustrated figure shows a logical "0" being written into the data node of a bit cell through driver INV1. As such, a logical "0" is written into the complementary data node through driver INV2.

Bit line boost circuit 102 is operative to assist the write operations in cell array 112. For example, bit line boost circuit 102 is operative to optimize the write Vccmin performance while minimizing the impact on transistor reliability. In example embodiments, bit line boost circuit 102 may be coupled either to a near-end or a far end of the pair of bit lines (BL/BLB). The near-end of the pair of bits lines is an end closer to write driver circuit 104 and the far-end is an end away from write driver circuit 104, or vice versa.

Bit line boost circuit 102 includes a first metal capacitor C1 106, a first logic device 108, and a discharge device N1 110. A boost signal is connected to an input of first logic device 108. First logic device 108 is operative to invert the boost signal. The output of first logic device 108 is connected to a gate of discharge device N1 110 at a node 2. In example embodiments, first logic device 108 is an invertor circuit, for instance, a NOT logic gate. However other types of logic gates are within the scope of the disclosure.

Discharge device N1 110 is connected between a first node (also referred to as node 1) which is the origin of the ground of the BL discharge path and the ground (VSS). In example embodiments, discharge device N1 110 is a transistor, for example, an n-channel metal-oxide semiconductor (nMOS) transistor. However, other types of transistors are in the scope of the disclosure. First metal capacitor C1 106 is connected between the node 1 and the node 2, that is, between the gate of discharge device N1 110 and the NVSS. First metal capacitor C1 106 of bit line boost circuit 102 is discussed in greater detail with respect for FIGS. 6, 7, 8, 9A, 9B, 9C, 10A, 10B, 10C, and 10D of the disclosure.

In example embodiments, the boost signal may be linked with write enable signal and be responsive to the write enable signal. A boost signal circuit (not shown) may be provided to generate the boost signal which is linked to the write enable signal. For example, when the write enable signal changes to a logic high indicating initiation of the write operation, the boost signal may also change to a logic high. In addition, when the write enable signal changes to a logic low indicating an end of the write operation, the boost signal may change to a logic low. In some examples, the write enable signal is delayed by a predetermined time to provide the boost signal.

During write operations, before the write enable signal changes to a logic high (at the start of the write operation/period), the boost signal is at a logic low. Hence, the node 2 of bit line boost circuit 102 is at logic high, which turns discharge device N1 110 on and charges first metal capacitor C1 106. In addition, when the boost signal is at a logic low, the node 1 is also connected to ground through discharge device N1 110.

When the write enable signal changes to a logic high (at the start of the write operation/period), the boost signal also changes to a logic high, which turns off discharge device N1 110 and, at the same time, causes a discharge from first metal capacitor C1 106, which drives a voltage of the node 1 from the ground to a negative value. This negative voltage is provided to the pair of bit lines (BL/BLB), which provides a boost for the write operation performed to bit cells coupled to the bit lines (BL/BLB).

Figure 2:
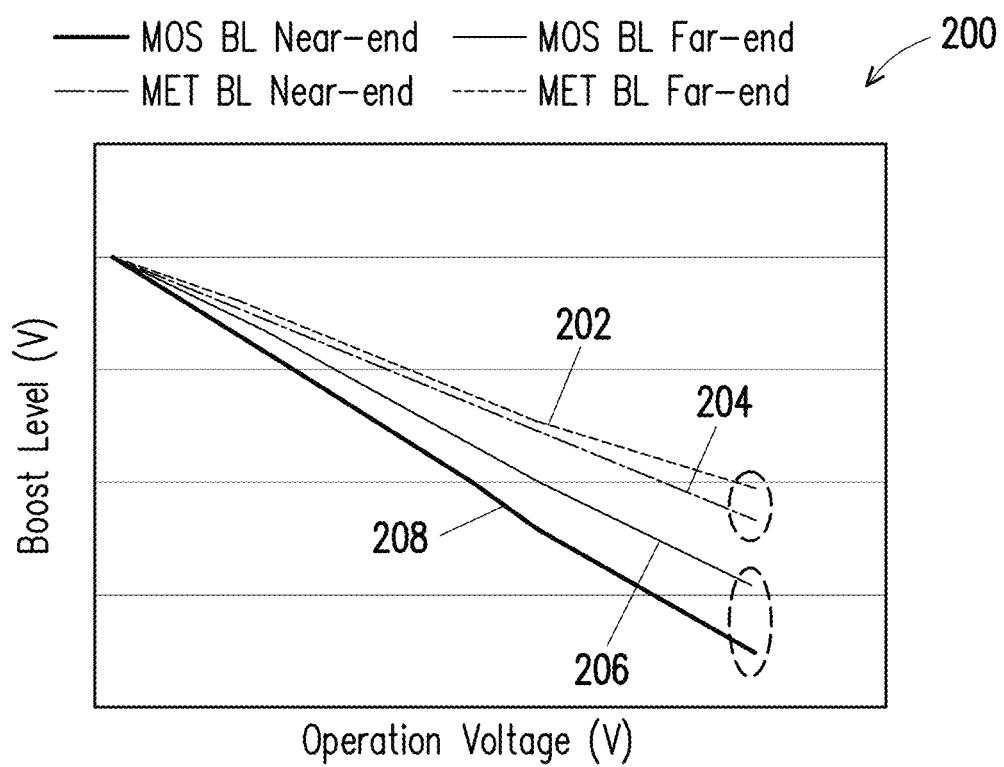
FIG. 2 is a graph illustrating the modeled results of using the first boost circuit in accordance with some embodiments.

FIG. 2 is a graph illustrating modeled results 200 of using first metal capacitor C1 106 in comparison with using a MOS capacitor for different operating voltages of cell array 112. For example, first plot 202 illustrates the modeled results of only using first metal capacitor 106 in a far end bit line boost circuit 102 for different operating voltages of cell array 112. Moreover, second plot 204 illustrates the modeled results of only using first metal capacitor C1 106 in a near-end bit line boost circuit 102 for different operating voltages of cell array 112. Furthermore, third plot 206 illustrates the modeled results of only using a MOS capacitor in a far-end write assist circuit for different operating voltages of cell array 112. Lastly, fourth plot 208 illustrates the modeled results of only using a MOS capacitor in a near-end write assist circuit for different operating voltages of cell array 112.

The graph illustrates that by using only a MOS capacitor the near-end results in a negative bit line voltage value are greater than the far-end values (as illustrated on the Y-axis). This result occurs regardless of the operating voltage of cell array 112 (as illustrated on the x-axis). However, the difference is more pronounced (e.g., Near>Far) as the operating voltage increases. In contrast by using first metal capacitor C1 106 in a far-end-write-assist circuit, the far-end results are more negative than the near-end. Again, this result occurs regardless of the operating voltage of cell array 112. However, the difference is greater (e.g., Far>Near) as the operating voltage increases.

Figure 3:
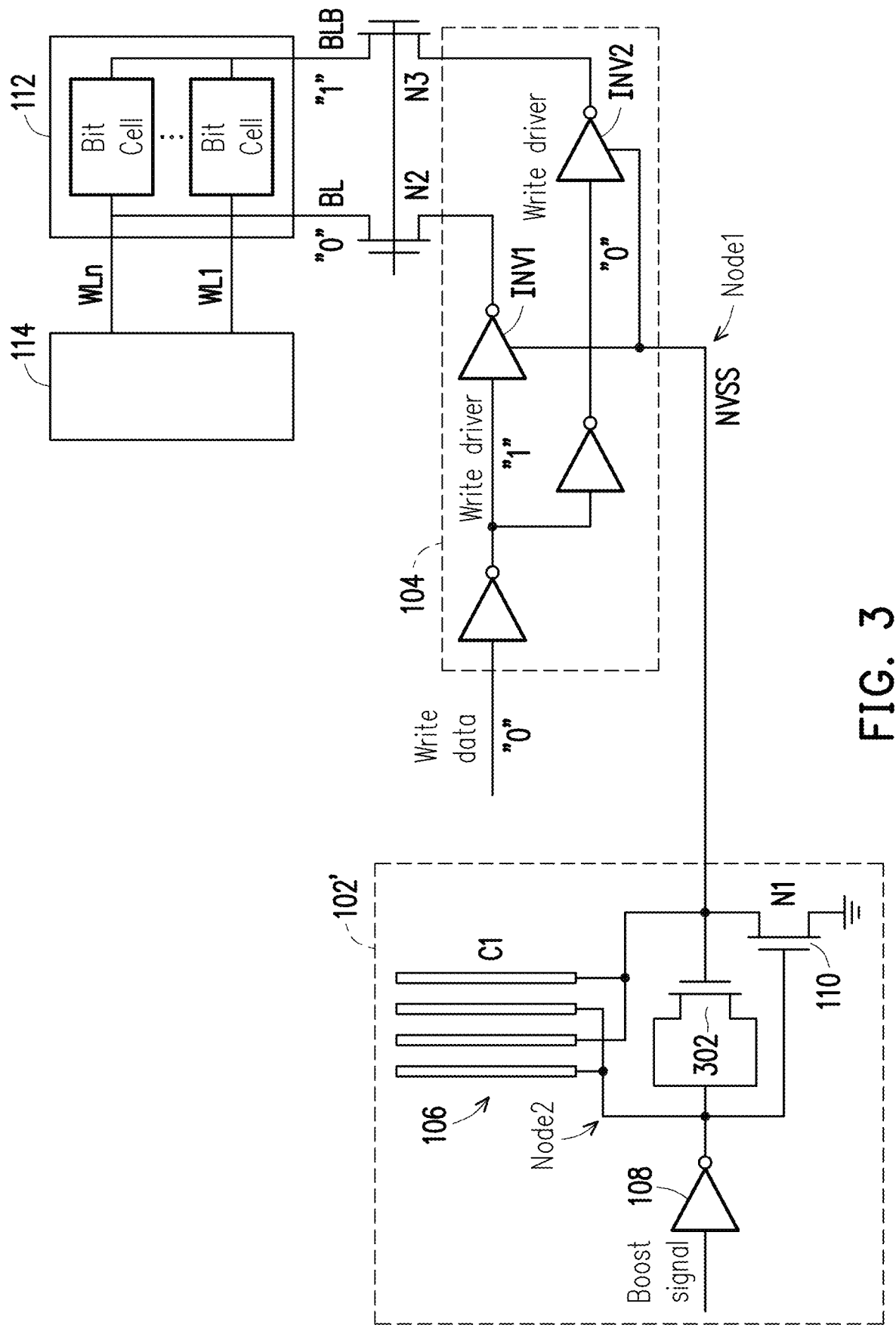
FIG. 3 is a schematic diagram illustrating aspects of an alternative embodiment of the first boost circuit in accordance with some embodiments.

FIG. 3 illustrates device 100 with an alternative embodiment of bit line boost circuit 102' in accordance with some embodiments. In this alternative embodiment, in addition to first metal capacitor C1 106, a first MOS capacitor 302 is added in parallel to first metal capacitor C1 106. Adding first MOS capacitor 302 in parallel to first metal capacitor C1 106 may reduce the real estate requirements of first metal capacitor C1 106.

Figure 4:
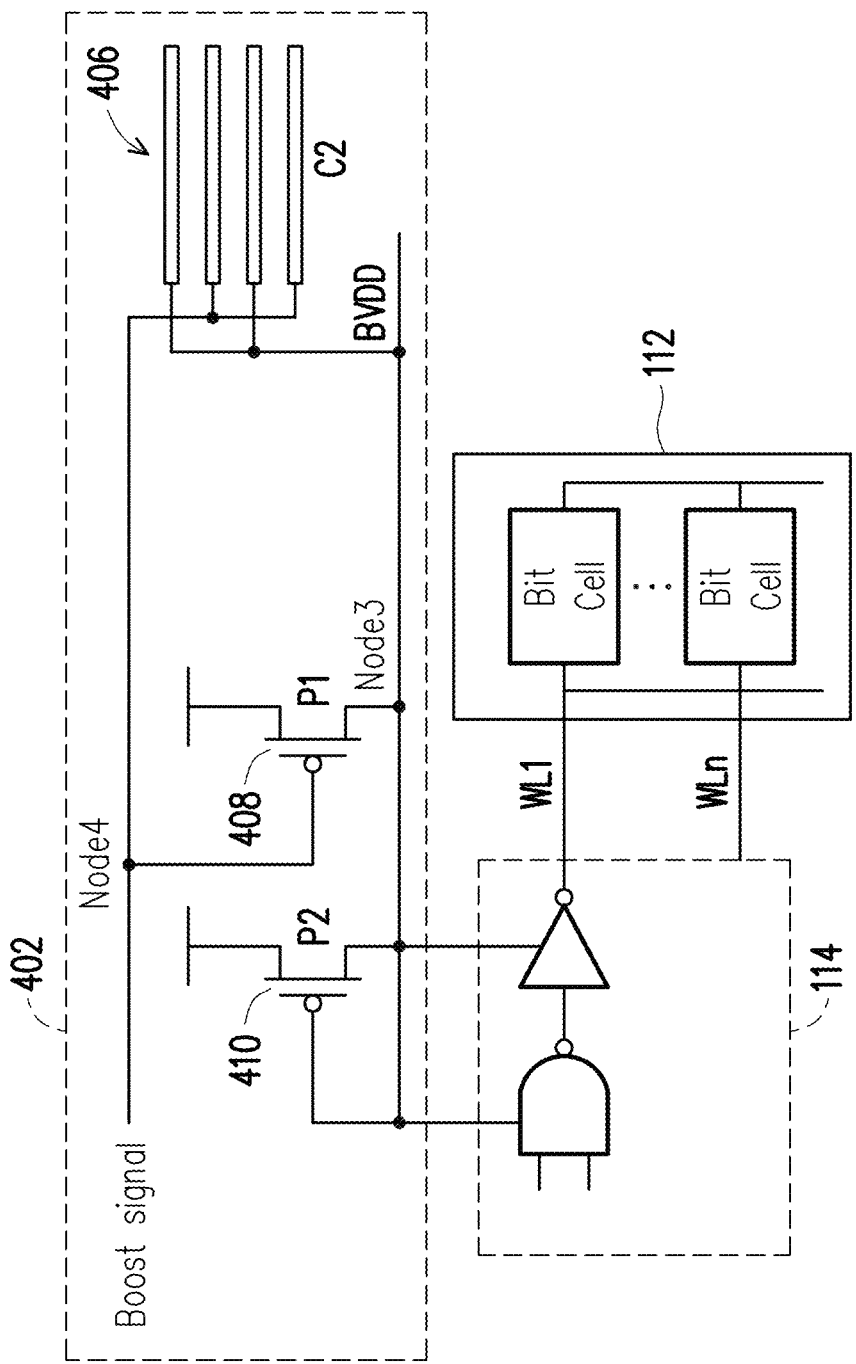
FIG. 4 is a schematic diagram of a device with a second boost circuit in accordance with some embodiments.

FIG. 4 illustrates device 100 with a second boost circuit in accordance with example embodiments. As shown in FIG. 4, device 100 includes a second boost circuit (also referred to as a word line boost circuit 402). Word line boost circuit 402 is coupled to word line driver circuit 114. As stated above, during the write operations, word line driver circuit 114 is operative to select one of the plurality of word lines of cell array 112 and charge the selected one of the plurality of word lines to a predetermined voltage. Word line boost circuit 402 is operative to boost the charge on the selected one of the plurality of word lines to assist in write operations in cell array 112. Word line boost circuit 402 is connected to word line driver circuit 114 at a node 3, also referred to as a boost node.

Word line boost circuit 402 includes a second metal capacitor C2 406, a first transistor P1 408, and a second transistor P2 410. First transistor P1 408 and second transistor P2 410 are connected between the VDD and the node 3. Gate of first transistor P1 408 is connected to a node 4. Gate of second transistor P2 410 is connected to the node 3. Second metal capacitor C2 406 is connected between the node 3 and the node 4. Boost signal is connected to a first place of second metal capacitor C2 406 through the node 4. First transistor P1 408 is also referred to as a pre-charge device. In example embodiments, first transistor P1 408 and second transistor P2 410 may be p-channel MOS transistors. However, other types of transistors are within scope of the disclosure. Second metal capacitor C2 406 is discussed in greater detail with respect to FIGS. 6, 7, 8, 9A, 9B, 9C, 11A, and 11B of the disclosure.

During operation, when the boost signal changes to a logic high, first transistor P1 408 is turned off which disconnects the node 3 from the VDD. In addition when the boost signal changes to a logic high, second metal capacitor C2 406 is charged to a voltage higher than the VDD. Hence, the voltage at the node 3 is boosted to a voltage higher than the VDD (that is, to a boosted VDD (BVDD)). The boosted voltage (BVDD) is then provided to the selected one of the plurality of word lines via word line driver circuit 114. The boosted voltage may assist in the write operations in cell array 112.

Figure 5:
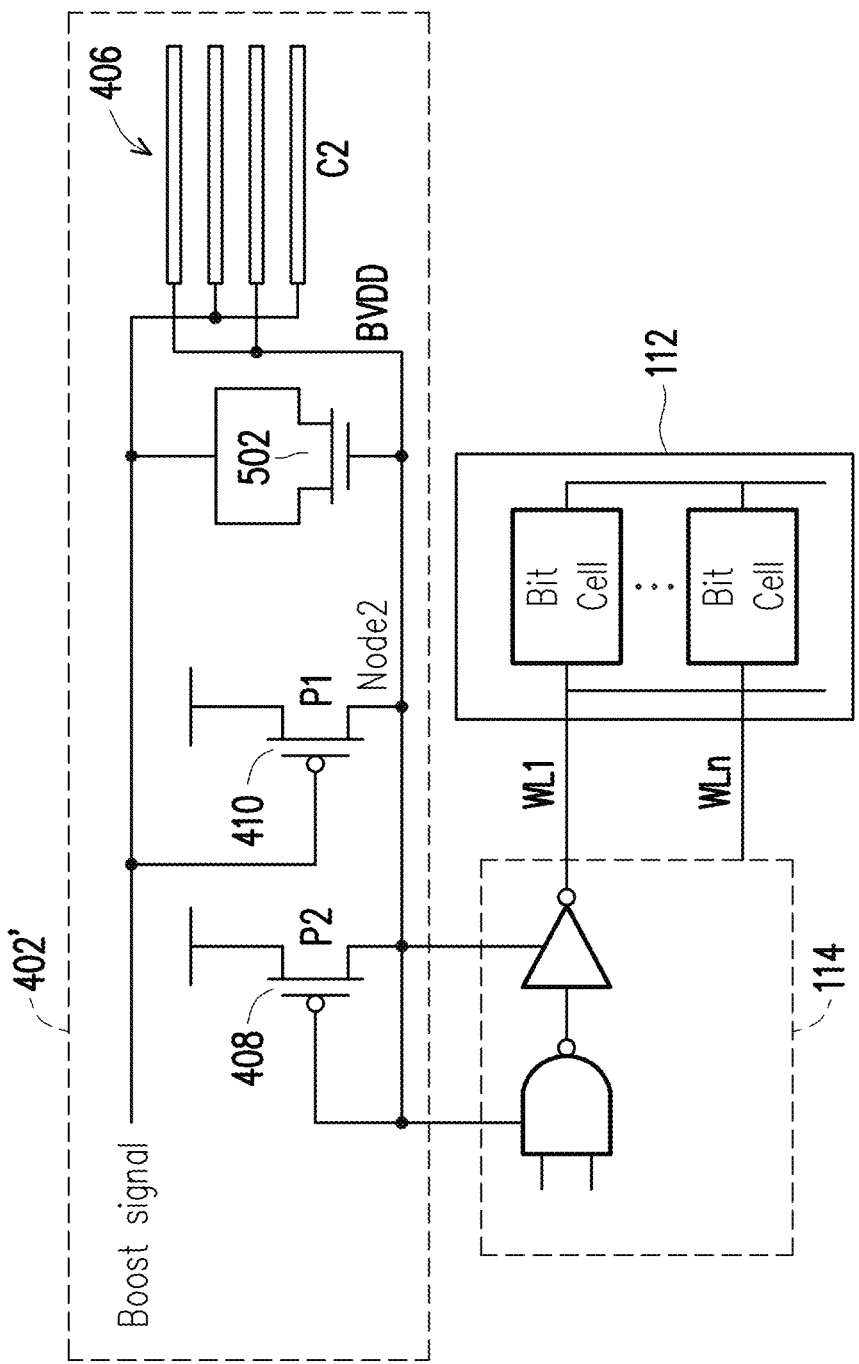
FIG. 5 is a schematic diagram illustrating aspects of an alternative embodiment of the second boost circuit in accordance with some embodiments.

FIG. 5 illustrates device 100 with an alternative embodiment of word line boost circuit 402' is in accordance with some embodiments. In this alternative embodiment, a second MOS capacitor 502 is added in parallel to second metal capacitor C2 406. Adding second MOS capacitor 502 in parallel to second metal capacitor C2 406 reduces the real estate requirements of second metal capacitor C2 406.

Figure 6:
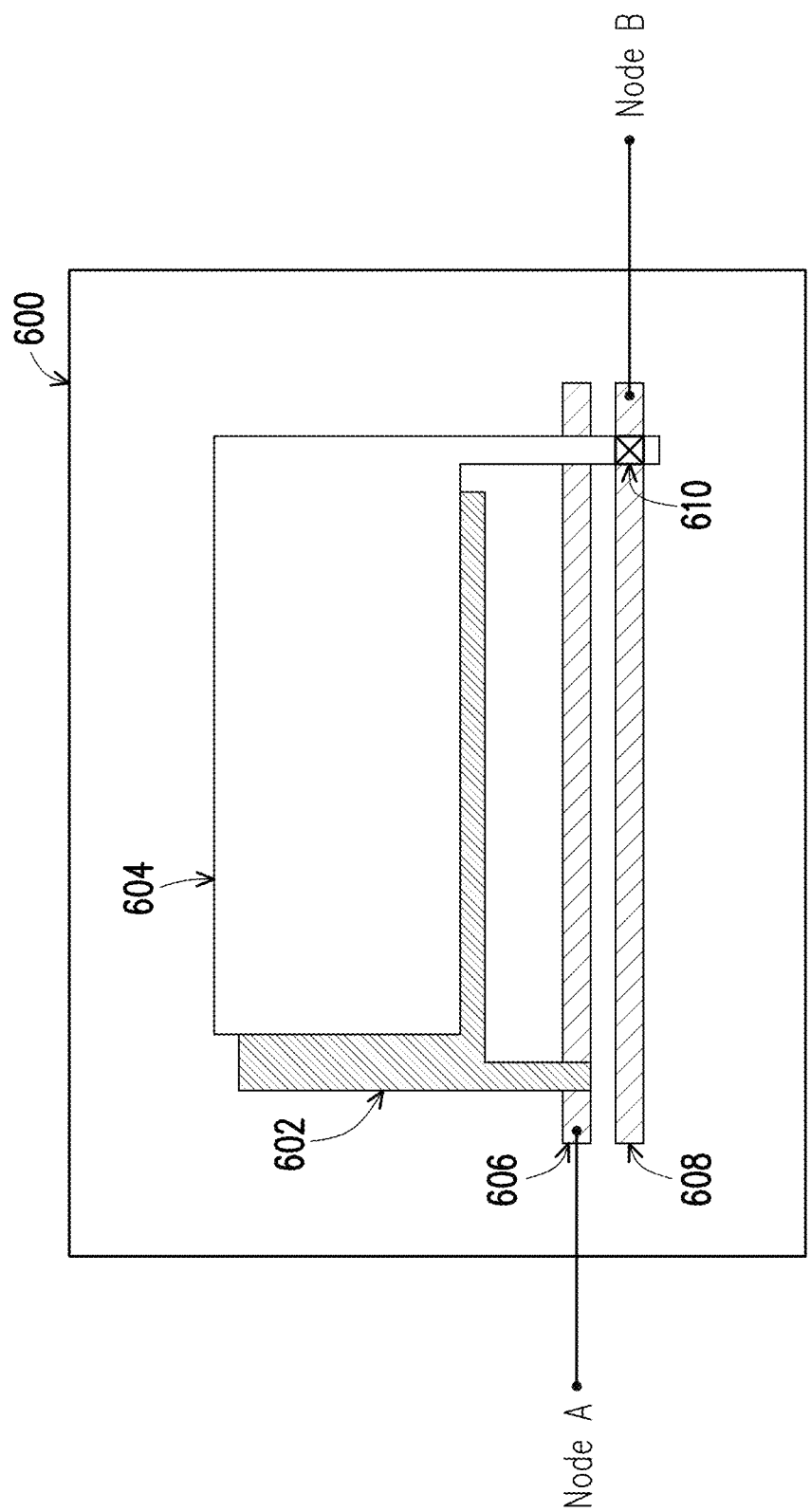
FIG. 6 is a schematic diagram illustrating a first example implementation of metal capacitors in accordance with some embodiments.

FIG. 6 illustrates a first example implementation 600 of first metal capacitor C1 106 and second metal capacitor C2 406 in accordance with some embodiments. In first example implementation 600, the metal capacitors are formed using two substantially parallel metal plates in two metal layers separated by a dielectric material. A first metal plate of the two substantially parallel metal plates which is formed in a first metal layer is connected to a first node. A second metal plate of the two substantially parallel metal plates which is formed in a second metal layer, which is different from the first metal layer of the first metal plate, is connected to a second node, thereby, forming a capacitor between the first node and the second node. A capacitance value in first example implementation 600 is varied by varying dimensions of the metal plates.

For example, and as shown in FIG. 6, first example implementation 600 includes a first metal plate 602 and a second metal plate 604 substantially parallel to first metal plate 602. First metal plate 602 is formed in the metal 3 layer and second metal plate 604 is formed in the metal 4 layer. First metal plate 602 is connected to a first metal line 606 which is connected to a first node (that is, Node A) and second metal plate 604 is connected to a second metal line 608 through a via 610. Second mental line 608 is connected to a second node (that is, Node B) thereby forming a capacitor between Node A and Node B. Node A and Node B be can be one of node 1, node 2, node 3, and node 4 of memory device 100. A capacitance value in first example implementation 600 is configurable to a desired capacitance value by configuring dimensions of first metal plate 602 and second metal plate 604.

First metal line 606 and second metal line 608 are also formed in a metal 3 layer. Second metal plate 604 is substantially parallel to first metal plate 602 and is separated from first metal plate 602 by a predetermined gap. In example embodiments, the predetermined gap can be filled with a dielectric material. The dielectric material may be a polymer such as polybenzoxazole (PBO), polyimide, benzocyclobutene (BCB), or the like; a nitride such as silicon nitride or the like; an oxide such as silicon oxide, Phospho-Silicate Glass (PSG), BoroSilicate Glass (BSG), Boron-doped PhosphoSilicate Glass (BPSG), or the like; the like, or a combination thereof. However, other types of dielectric materials are within scope of the disclosure.

Although first metal plate 602 is shown to be formed in metal 3 layer and second metal plate 604 is shown to be formed in metal 4 layer, other metal layers are within scope of the disclosure for both first metal plate 602 and second metal plate 604. In addition, although first metal line 606 and second metal line 608 are shown be formed in the same metal layer as first metal plate 602 (that is, metal 3 layer), it will be apparent to a person with ordinary skill in the art after reading this disclosure that first metal line 606 and second metal line 608 can be formed in the same metal layer as second metal plate 604 (that is, metal 4 layer). Dimensions and shapes of each of first metal plate 602 and second metal plate 604 can be based on a desired capacitance value.

In example embodiments, a first metal layer (also referred to as a metal 1 layer) is generally the lowest metal layer in an integrated circuit (IC). That is, the metal 1 layer is the metal layer closest to a substrate on which the metal layers are formed. A second metal layer (also referred to as a metal 2 layer) is the metal layer formed above the metal 1 layer without any other metal layer between the metal 1 layer and the metal 2 layer. Likewise, a third metal layer (also referred to as the metal 3 layer) is the next metal layer formed above the metal 2 layer without any other metal layer between the metal 2 layers and the metal 3 layer. Similarly, a fourth metal layer (also referred to as the metal 4 layer) is the next metal layer formed above the metal 3 layer without any other metal layer between the metal 3 layers and the metal 4 layer. The progression of metal layers continues in this fashion until a top metal layer is formed, for example, the eighth metal layer (also referred to as metal 8 layer) formed above a seventh metal layer (also referred to as metal 7 layer) without any other metal layer between the metal 7 layer and the metal 8 layer. It is to be understood that the disclosure is not limited to any specific number of metal layers.

Figure 7:
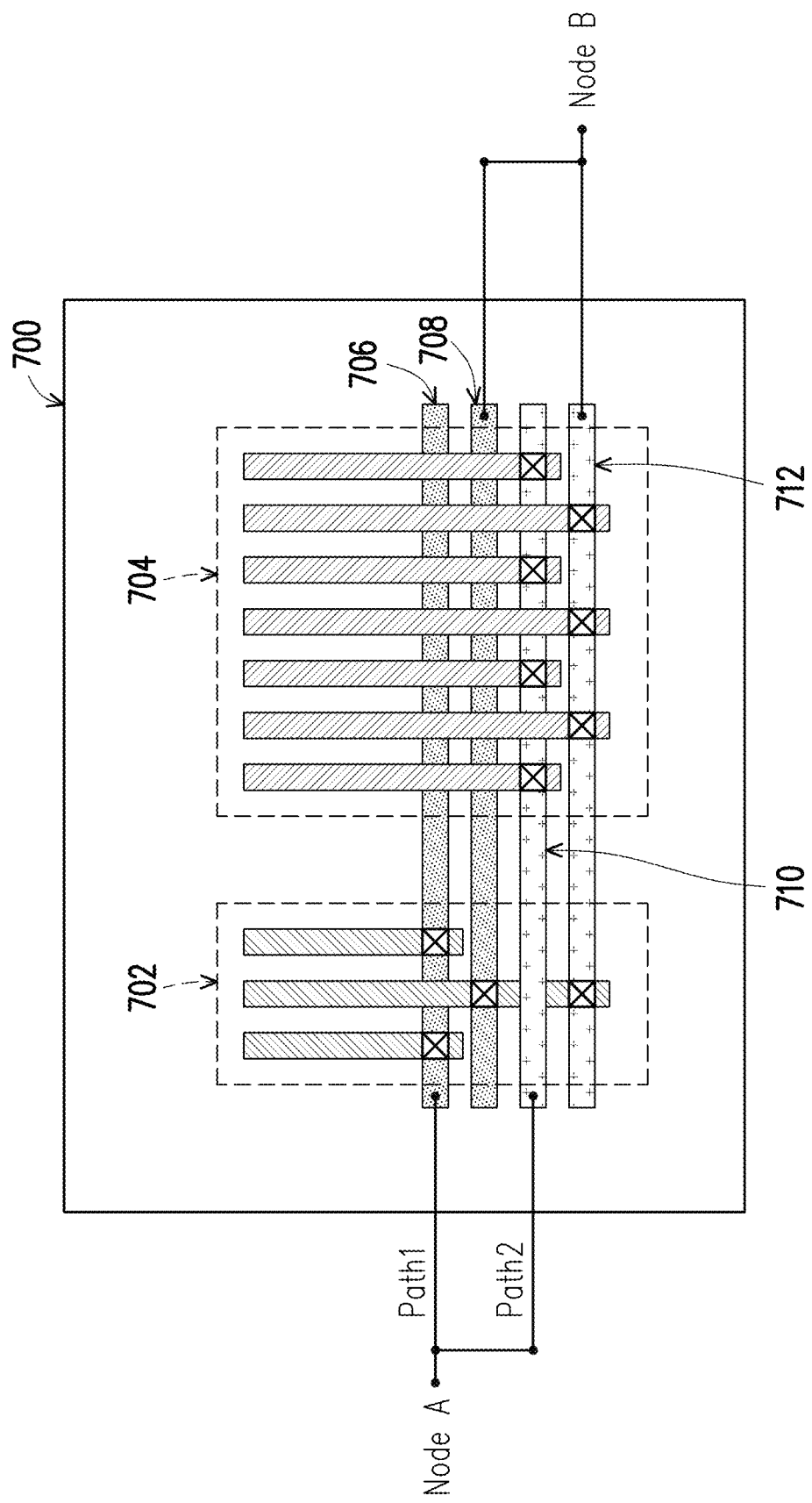
FIG. 7 is a schematic diagram illustrating a second example implementation of metal capacitors in accordance with some embodiments.

FIG. 7 illustrates a second example implementation 700 of first metal capacitor C1 106 and second metal capacitor C2 406 in accordance with some embodiments. Second example implementation 700, which is also referred to as hand clasping style, includes two sub-capacitors, that is a first sub-capacitor and a second sub-capacitor, formed in parallel to each other. The two sub-capacitors are formed from two sets of metal stripes. For instance, a first sub-capacitor is formed from a first set of metal stripes and a second sub-capacitor is formed parallel to the first sub-capacitor from a second set of metal stripes. First set of metal stripes are placed parallel to each other thereby forming a capacitor between each two consecutive metal stripes. Similarly, second set of metal stripes are also placed parallel to each other thereby forming a capacitor between each two consecutive metal stripes. A capacitance value of each of the two sub-capacitors is dependent on a number of metal stripes and dimensions of metal stripes in each corresponding set of metal stripes and a length of each metal stripes. An overall capacitance value in second example implementation 700 is determined as sum of the two sub-capacitors formed by the two set of metal stripes.

For example, and as shown in FIG. 7, second example implementation 700 includes a first sub-capacitor formed from a first set of metal stripes 702 and a second sub-capacitor formed from a second set of metal stripes 704. Each of a first set of metal stripes 702 and second set of metal stripes 704 are formed in two different metal layers. For example, first set of metal stripes 702 are formed in a metal 2 layer and second set of metal stripes 704 formed in a metal 4 layer. However, other metal layers are within the scope of disclosure.

Continuing with FIG. 7, the first sub-capacitor is formed between a first pair of metal lines (that is, a first metal line 706 and a second metal line 708). Each of first metal line 706 and second metal line 708 are formed in metal 1 layer and form a path 1. Moreover, each of first set of metal stripes 702 are connected to first metal line 706 or second metal line 708 in alternate through a via. Second sub-capacitor is formed between a second pair of metal lines (that is, a third metal line 710 and a fourth metal line 712). Each of third metal line 710 and fourth metal line 712 are formed in metal 3 layer and form a path 2. Each of second set of metal stripes 704 are connected to third metal line 710 or fourth metal line 712 in alternate through a via. First metal line 706 and third metal line 710 are connected to a first node (that is, Node A), and second metal line 708 and fourth metal line 712 are connected to a second node (that is, Node B) thereby forming a capacitor between Node A and Node B. Node A and Node B be can be one of node 1, node 2, node 3, and node 4 of memory device 100.

Each of first set of metal stripes 702 and second set of metal stripes 704 include a predetermined number of metal stripes placed parallel to each other. A capacitor is formed between each two consecutive metal stripes. A total capacitance value for each of first set of metal stripes 702 and second set of metal stripes 704, thus, is dependent upon a number of metal stripes and dimensions of metal stripes in a corresponding set. For example, first set of metal stripes 702 includes three metal stripes and second set of metal stripes 704 includes seven metal stripes. However, a number of metal stripes for each of first set of metal stripes 702 and second set of metal stripes 704 may vary based on a desired capacitance value of each of the first sub-capacitor and the second sub-capacitor. Hence, a different number of metal stripes for each of first set of metal stripes 702 and second set of metal stripes 704 is within the scope of the disclosure. In addition, the dimensions of each metal stripes of first set of metal stripes 702 and second set of metal stripes 704 may also vary based on a desired capacitance value of the first sub-capacitor and the second sub-capacitor.

In example implementations, each metal stripes of first set of metal stripes 702 are parallel to each other with gaps between the stripes being filled with a dielectric material. Similarly, each metal stripes of second set of metal stripes 704 are parallel to each other with gaps between the stripes being filled with a dielectric material. An example dielectric material can include a polymer such as polybenzoxazole (PBO), benzocyclobutene (BCB), or the like; a nitride such as silicon nitride or the like; an oxide such as silicon oxide, PhosphoSilicate Glass (PSG), BoroSilicate Glass (BSG), Boron-doped PhosphoSilicate Glass (BPSG), or the like; the like, or a combination thereof. However, other dielectric materials are within scope of the disclosure.

In other example implementation, one of the first sub-capacitor and the second sub-capacitor can be selectively de-activated. For example, one of the first sub-capacitor and the second sub-capacitor can be selectively de-activated disconnecting it from the boost signal path (that is, disconnecting path 1 or path 2). The one of the first sub-capacitor and the second sub-capacitor can be selectively de-activated to vary the desired capacitance value. In other example implementation, each of path 1 or path 2 may include a switches (not shown) which are operative to selectively activate each of the first sub-capacitor and the second sub-capacitor respectively.

Figure 8:
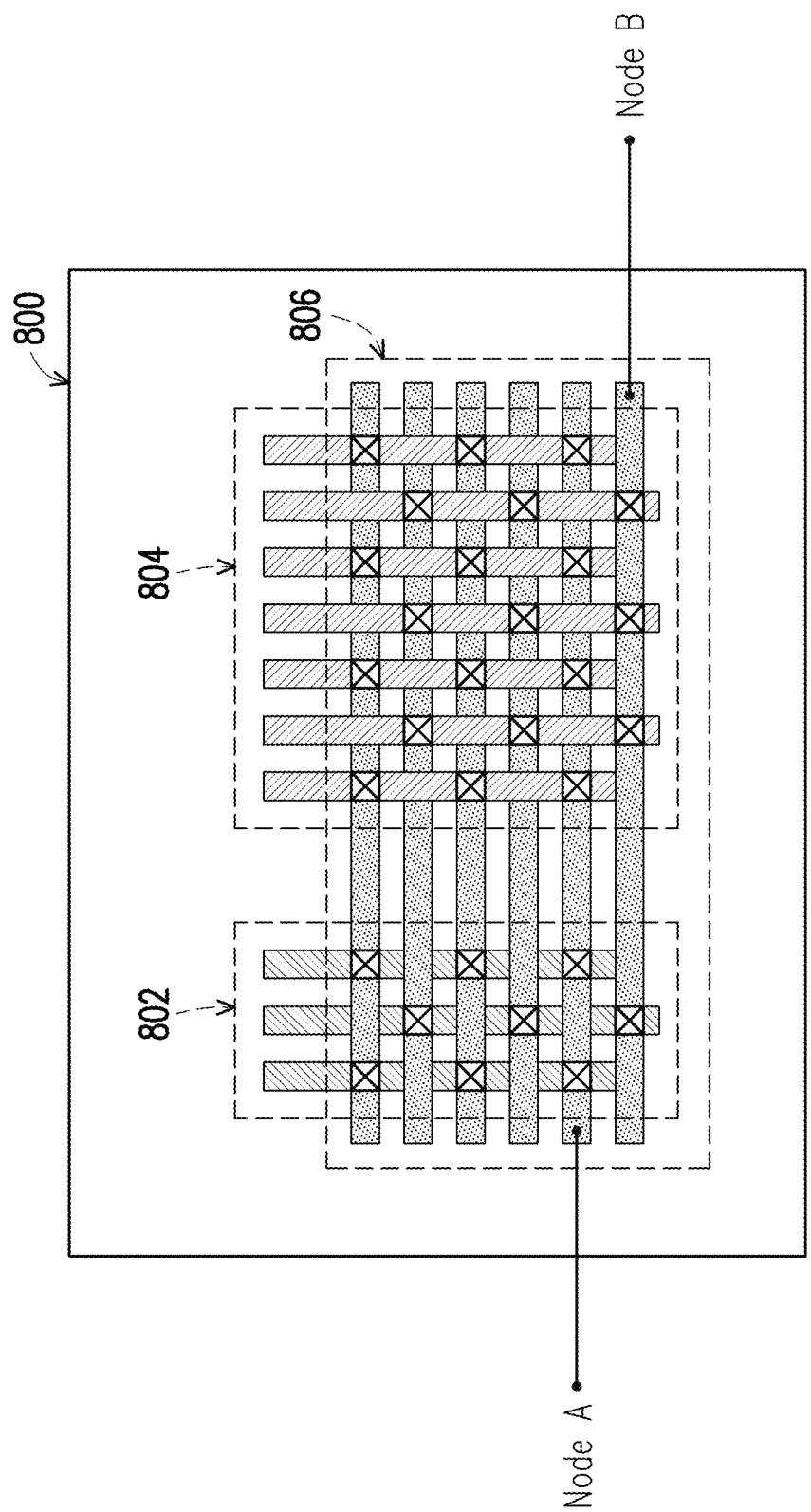
FIG. 8 is a schematic diagram illustrating a third example implementation of metal capacitors in accordance with some embodiments.

FIG. 8 illustrates a third example implementation 800 of first metal capacitor C1 106 and second metal capacitor C2 406 in accordance with some embodiments. Third example implementation 800, which is also referred to as a grid style, includes three set of metal stripes. Each of the three set of metal stripes form three sub-capacitors. For example, a first sub-capacitor is formed from a first set of metal stripes placed parallel to each other, a second sub-capacitor is formed from a second set of metal stripes placed parallel to each other, and a third sub-capacitor is formed from a third set of metal stripes placed parallel to each other. Each successive metal stripe of each of the first set of metal stripes and the second set of metal stripes are connected to metal stripes of the third set of metal stripes in alternate thereby forming a grid. A capacitance value of each of the three sub-capacitors is dependent on a number of metal stripes in each corresponding set of metal stripes and dimensions of each metal stripes. An overall capacitance value in third example implementation 800 is determined as sum of the three sub-capacitors formed by the three set of metal stripes.

For example, and as shown in FIG. 8, third implementation 800 includes a first set of metal stripes 802, a second set of metal stripes 804, and a third set of metal stripes 806. Third metal set of stripes 806 may be placed in a first direction, and first set of metal stripes 802 and second set of metal stripes 804 may each be formed in a second direction. The second direction may be orthogonal to the first direction. Each metal stripe of first set of metal stripes 802 and each metal stripe of second set of metal stripes 804 are connected to each alternate metal stripe of third set of metal stripes 806 through a via forming a grid. That is, a first metal stripe of each of first set of metal stripes 802 and second set of metal stripes is connected to a second, fourth, sixth, . . . , metal stripe of third set of metal stripes 806. And, a second metal stripe of each of first set of metal stripes 802 and second set of metal stripes is connected to a first, third, fifth, . . . , metal stripe of third set of metal stripes 806.

A capacitor is formed between two adjacent pair of metal stripes of each of first set of metal stripes 802, second set of metal stripes 804, and third set of metal stripes 806. A capacitance value for each of the first sub-capacitor formed by first set of metal stripes 802, the second sub-capacitor formed by second set of metal stripes 804 and the third sub-capacitor formed by third set of metal stripes 806 is dependent upon a number of metal stripes in each set and dimensions of each metal stripes. Hence, each of first set of metal stripes 802, second set of metal stripes 804, and third set of metal stripes 806 include a predetermined number of metal stripes. For example, first set of metal stripes 802 includes three metal stripes, second set of metal stripes 804 includes seven metal stripes, and third set of metal stripes 806 includes six metal stripes. However, a number of metal stripes in each of first set of metal stripes 802, second set of metal stripes 804, and third set of metal stripes 806 may vary based on a desired capacitance value. Hence, a different number of metal stripes for each of first set of metal stripes 802, second set of metal stripes 804, and third set of metal stripes 806 is within the scope of the disclosure. In addition, a dimension of the metal stripes of in each of first set of metal stripes 802, second set of metal stripes 804, and third set of metal stripes 806 may vary based on a desired capacitance value. One stripe of third set of metal stipes 806 is connected to a first node (that is, Node A) and another stripe of third set of metal stripes 806 is connected to a second node (that is, Node B) thereby forming a capacitor between Node A and Node B. Node A and Node B be can be one of node 1, node 2, node 3, and node 4 of memory device 100.

Each metal stripe of first set of metal stripes 802 are parallel to each other with gaps between the metal stripes being filled with a dielectric material. Similarly, each metal stripes of second set of metal stripes 804 are parallel to each other with gaps between the stripes being filled with a dielectric material. Additionally, each metal stripes of third set of metal stripes 806 are parallel to each other with gaps between the stripes being filled with a dielectric material. An example dielectric material can include a polymer such as polybenzoxazole (PBO), polyimide, benzocyclobutene (BCB), or the like; a nitride such as silicon nitride or the like; an oxide such as silicon oxide, PhosphoSilicate Glass (PSG), BoroSilicate Glass (BSG), Boron-doped PhosphoSilicate Glass (BPSG), or the like; the like, or a combination thereof. However, other dielectric materials are within scope of the disclosure.

In addition, each of first set of metal stripes 802, second set of metal stripes 804, and third set of metal stripes 806 can be different metal layers. For example, first set of metal stripes 802 are in the metal 2 layer, second set of metal stripes 804 are in the metal 4 layer, and third set of metal stripes 806 are in the metal 3 layer. However, other metal layers are within scope of the disclosure. In some implementations two of first set of metal stripes 802, second set of metal stripes 804, and third set of metal stripes 806 can be in a same metal layer and the remaining being in a different metal layer. For example, the metal stripes of each of first set of metal stripes 802 and second set of metal stripes 804 can be in metal 2 layer or metal 4 layer, and third set of metal stripes 806 can be in metal 3 layer.

Figure 9A:
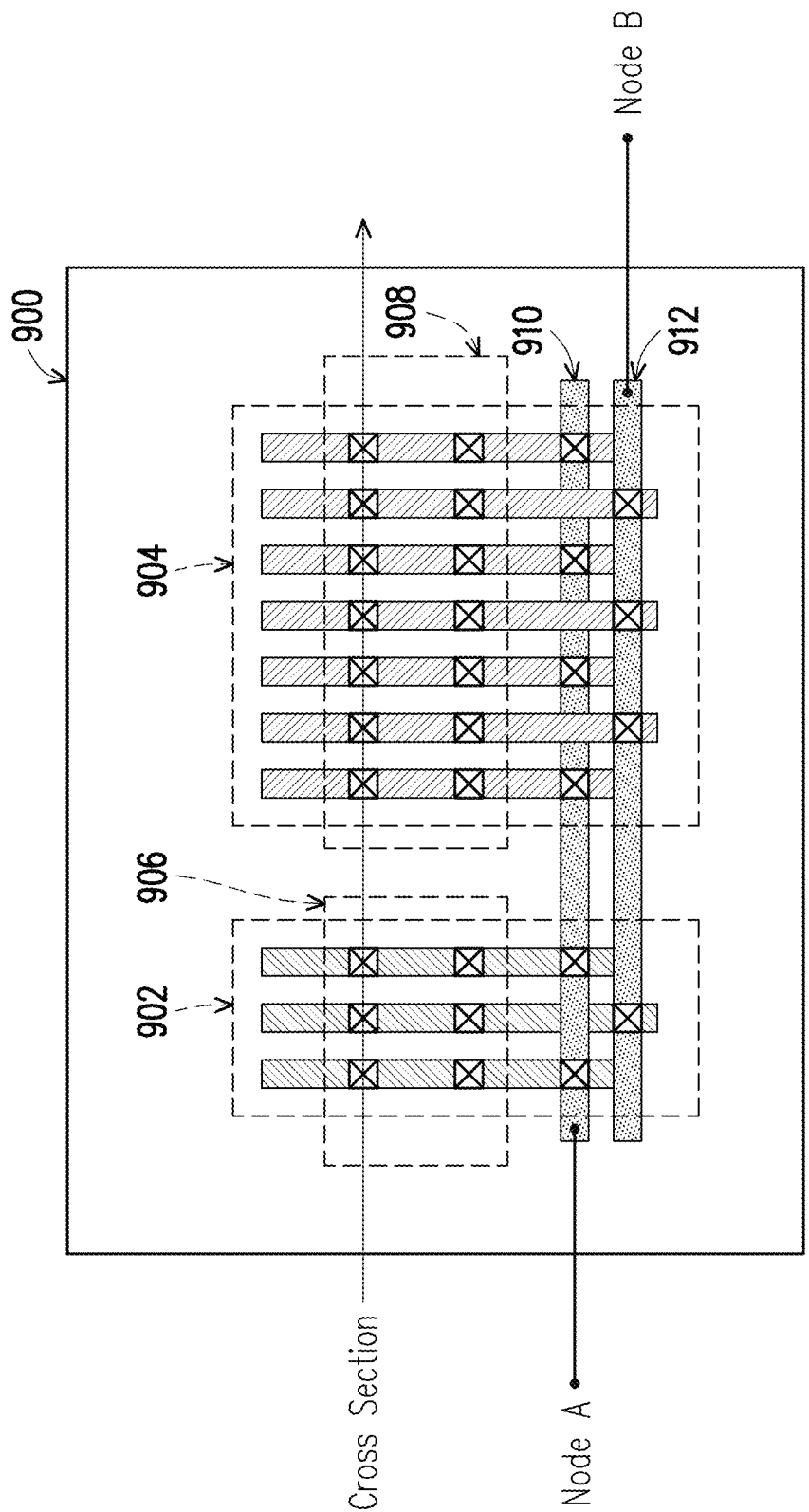
FIGS. 9A, 9B, and 9C are schematic diagrams illustrating a fourth example implementation of metal capacitors in accordance with some embodiments.

FIG. 9A illustrates a fourth example implementation 900 of first metal capacitor C1 106 and second metal capacitor C2 406 in accordance with some embodiments. Fourth example implementation 900, which is also referred to as via style, includes two sets of metal stripe. In addition, fourth example implementation 900 includes a plurality of vias formed on the metal stripes. Each of the two set of metal stripes form two sub-capacitors. For example, a first sub-capacitor is formed from a first set of metal stripes placed parallel to each other and a second sub-capacitor is formed from a second set of metal stripes placed parallel to each other. Moreover, additional capacitors are formed from the plurality of vias. For example, each of the two adjacent vias form a capacitor between them. A capacitance value of each of the two sub-capacitors is dependent on a number of metal stripes in each corresponding set of metal stripes, dimensions (that is, a length, a width, and a thickness) of the metal stripes, a number of vias in each corresponding set of metal stripes, and dimensions (that is, a length, a width, and a thickness) of each vias. An overall capacitance value in fourth example implementation 900 is determined as sum of the two sub-capacitors formed by the two set of metal stripes.

For example, and as shown in FIG. 9A, fourth example implementation 900 includes a first set of metal stripes 902 and a second set of metal stripes 904. Each of first set of metal stripes 902 and second set of metal stripes 904 are in different metal layers. For example, first set of metal stripes 902 are in the metal 2 layer and second set of metal stripes 904 are in the metal 4 layer. However, other metal layers are within the scope of disclosure. In some implementations, each of first set of metal stripes 902 and second set of metal stripes 904 are in a same metal layer.

Each of first set of metal stripes 902 and second set of metal stripes 904 include a predetermined number of metal stripes. For example, first set of metal stripes 902 includes three metal stripes and second set of metal stripes 904 includes seven metal stripes. However, a number of metal stripes may vary based on a desired capacitance value. Hence, a different number of metal stripes for each of first set of metal stripes 902 and second set of metal stripes 904 is within the scope of the disclosure.

Figure 9B:
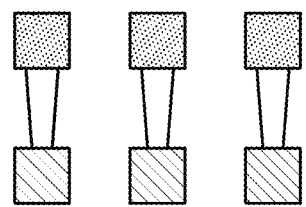
Figure 9C:
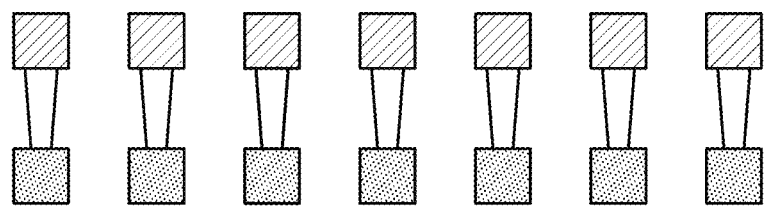

First set of metal stripes 902 includes a first plurality of vias 906 and second set of metal stripes 904 include a second plurality of vias 908. Each pair of adjacent vias of first plurality of vias 906 and second plurality of vias 908 form a capacitor between them. Therefore, a number of vias in each of first plurality of vias 906 and second plurality of vias 908 can be changed to change a capacitance value of fourth example implementation 900. FIGS. 9B illustrates example cross-sectional view of first metal stripes 902 including first plurality of vias 906. As shown in FIG. 9B, first plurality of vias 906 are formed in metal 3 layer. However, other metal layers are within the scope of the disclosure. FIGS. 9C illustrates example cross-sectional view of second metal stripes 904 including second plurality of vias 908. As shown in FIG. 9C, second plurality of vias 908 are formed in metal 5 layer. However, other metal layers are within the scope of the disclosure. Moreover, each of first plurality of metal stripes 902 and second plurality of metal stripes 904 is shown to include two rows of vias. However, different number of rows of vias are within the scope of the disclosure.

Continuing with FIG. 9A, each metal stripes of first set of metal stripes 902 and second set of metal stripes 904 are connected to a first metal line 910 and second metal line 912 in alternate. First metal line 910 is connected to a first node (that is, Node A) and second metal line 912 is connected to a second node (that is, Node B). In fourth example implementation, a capacitor is formed between the Node A and the Node B. Node A and Node B be can be one of node 1, node 2, node 3, and node 4 of memory device 100.

In addition, dimensions of each metal stripes of first set of metal stripes 902 and second set of metal stripes 904 may also vary based on a desired capacitance value. In example embodiments, each metal stripe of first set of metal stripes 902 are parallel to each other with gaps between the stripes being filled with a dielectric material. Similarly, each metal stripe of second set of metal stripes 904 are parallel to each other with gaps between the stripes being filled with a dielectric material. Examples of the dielectric material include a polymer such as polybenzoxazole (PBO), polyimide, benzocyclobutene (BCB), or the like; a nitride such as silicon nitride or the like; an oxide such as silicon oxide, PhosphoSilicate Glass (PSG), BoroSilicate Glass (BSG), Boron-doped PhosphoSilicate Glass (BPSG), or the like; the like, or a combination thereof. However, other dielectric materials are within scope of the disclosure.

In example embodiments, a length of metal stripes forming first metal capacitor C1 106 may be varied based on a length of a bit line of cell array 112. For example, the length of the metal stripes forming first metal capacitor C1 106 may be extended approximately equal to a length of the bit line of cell array 112. In some example, the length of the metal stripes of first set of metal stripes 702, 802, and 902 or second set of metal stripes 704, 804, and 904 forming first metal capacitor C1 106 may be extended approximately equal to a length of the bit line of cell array 112. The extended lengths of the metal stripes may be varied to vary the capacitance value as well as an amount of power spent for the write operations.

Figure 10A:
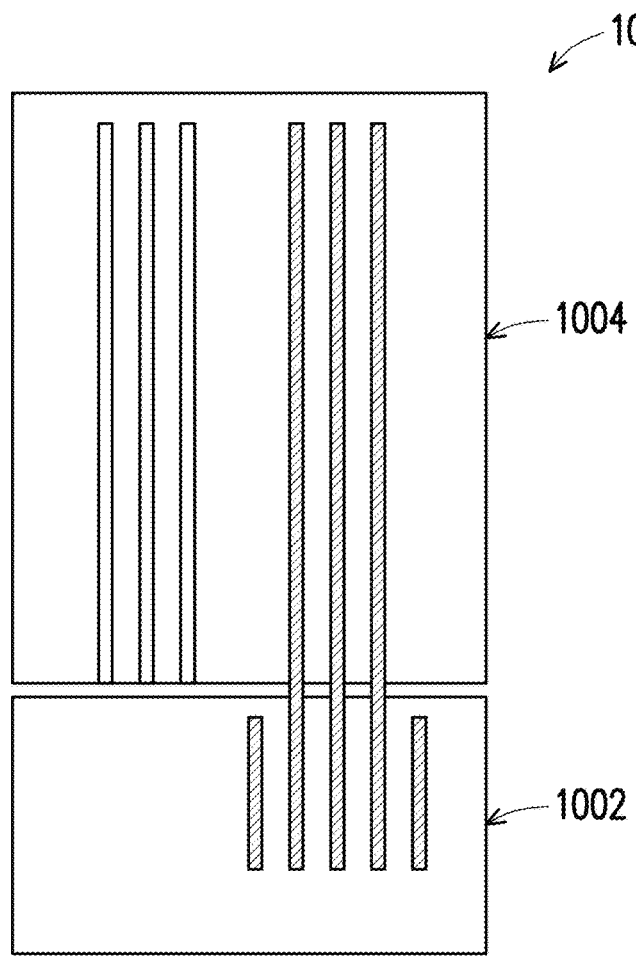
FIGS. 10A and 10B are schematic diagrams illustrating different lengths for metal stripes of metal capacitors for the first boost circuit in accordance with some embodiments.
Figure 10B:
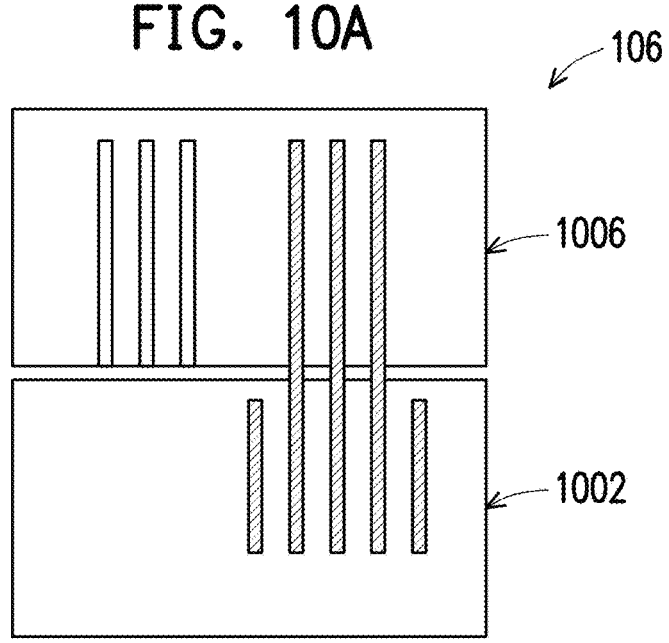

FIGS. 10A and 10B illustrates different lengths for the metal stripes forming first metal capacitor C1 106 in accordance with some embodiments. As illustrated in FIGS. 10A and 10B, the length of the metal stripes includes a base length 1002 and extended lengths 1004 and 1006. Extended lengths 1004 and 1006 can track the length of the bit line, and hence may extend to be equal to the length of a bit line of cell array 112. For example, and as illustrated in FIGS. 10A and 10B, extended length 1004 of FIG. 10A which is associated with a longer bit line is longer than extended length 1006 of FIG. 10B which is associated with a shorter bit line.

Figure 10C:
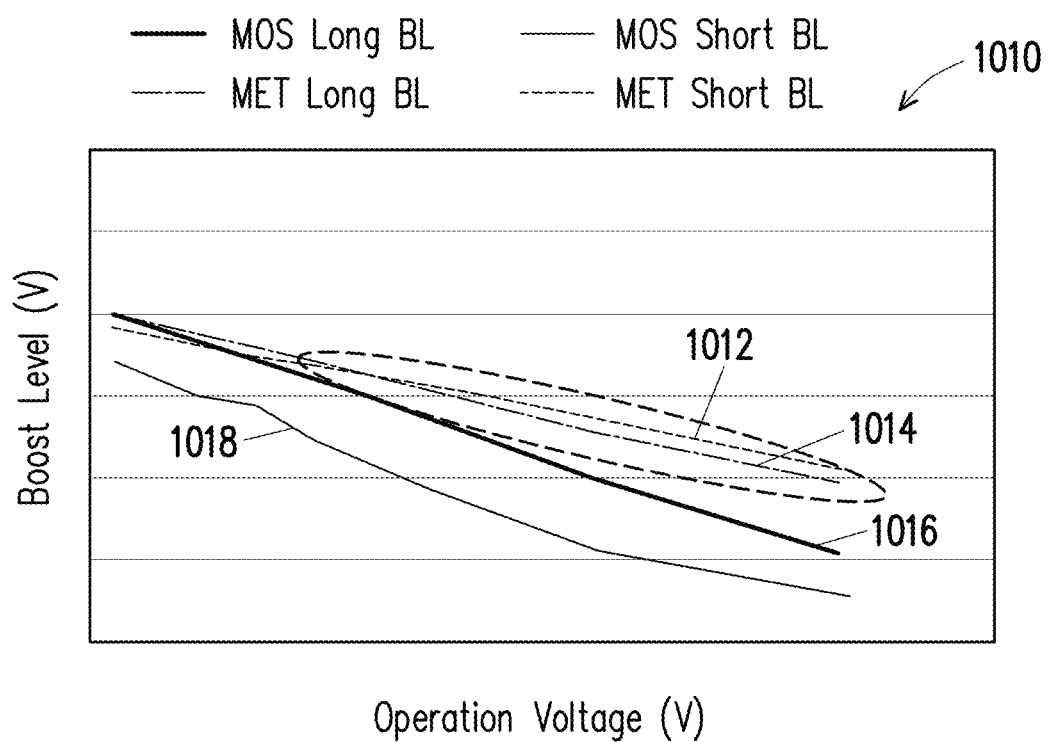
FIG. 10C a graph illustrating the modeled results of the different lengths for metal stripes of metal capacitors for the first boost circuit in accordance with some embodiments.

FIG. 10C illustrates a graph 1010 illustrating modeled results of using extended length metal stripes for first metal capacitor C1 106 in comparison with using long MOS capacitor bit line boost circuit 102 for different operating voltages of cell array 112. For example, first plot 1012 illustrates the modeled results of base length 1002 metal stripes for first metal capacitor C1 106, second plot 1014 illustrates the modeled results of extended lengths 1004 and 1006 metal stripes for first metal capacitor C1 106, third plot 1016 illustrates the modeled results of using a base length MOS capacitor, and fourth plot 1018 illustrates the modeled results of using an extended length MOS capacitor. As shown in FIG. 10C a gap between voltage values are less for first metal capacitors C1 106 compared to the MOS capacitor with the change in the length of the metal stripes.

Figure 10D:
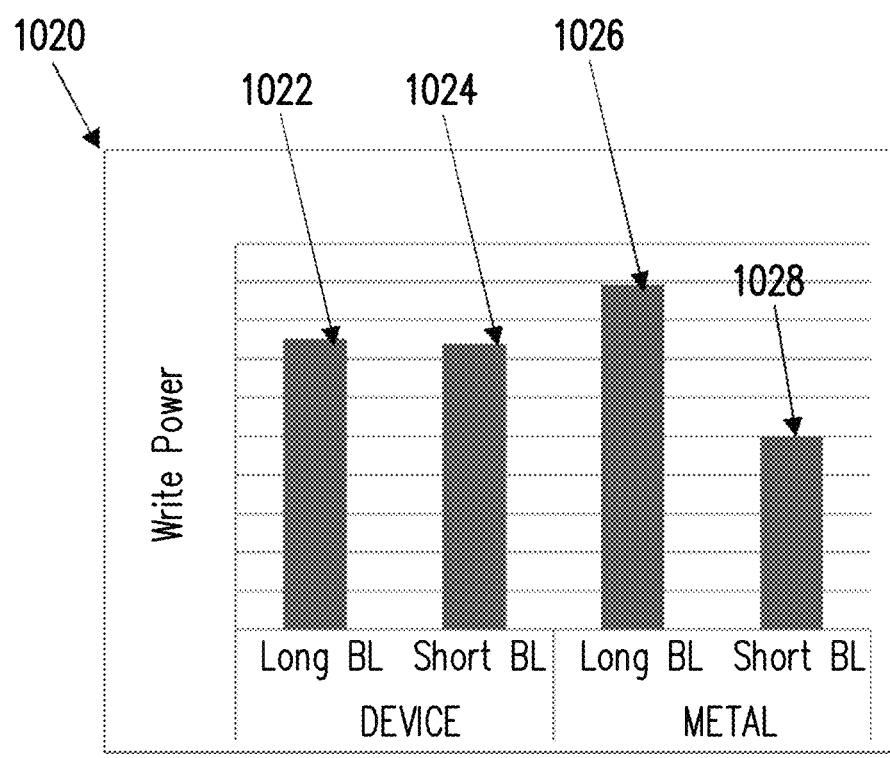
FIG. 10D a graph illustrating the modeled results of power consumption for write assist operation using different lengths for metal stripes forming metal capacitors of the first boost circuit in accordance with some embodiments.

FIG. 10D illustrates a histogram 1020 of power consumption during write operations for cell array 112. For example, first histogram 1022 illustrates a power consumption of an extended length MOS capacitor, second histogram 1024 illustrates a power consumption of a base length bit line MOS capacitor, a third histogram 1026 illustrates a power consumption of an extended length first metal capacitor C1 106, and fourth histogram 1028 illustrates a power consumption of a basic length first metal capacitor C1 106. As shown in histogram 1020, the power consumption for the write operations remains same with variation in length of the MOS capacitors. However, the power consumption of extended length 1004 and 1006 metal stripes is higher than that of a base length 1002 metal stripes for first metal capacitor C1 106.

Figure 11A:
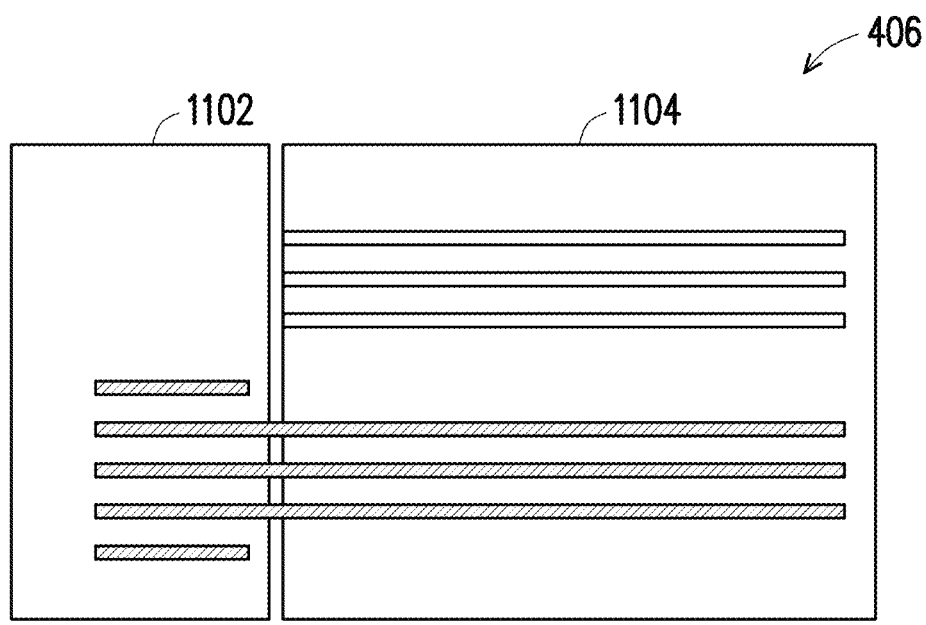
FIGS. 11A and 11B are schematic diagrams illustrating different lengths for metal stripes of metal capacitors of the second boost circuit in accordance with some embodiments.
Figure 11B:
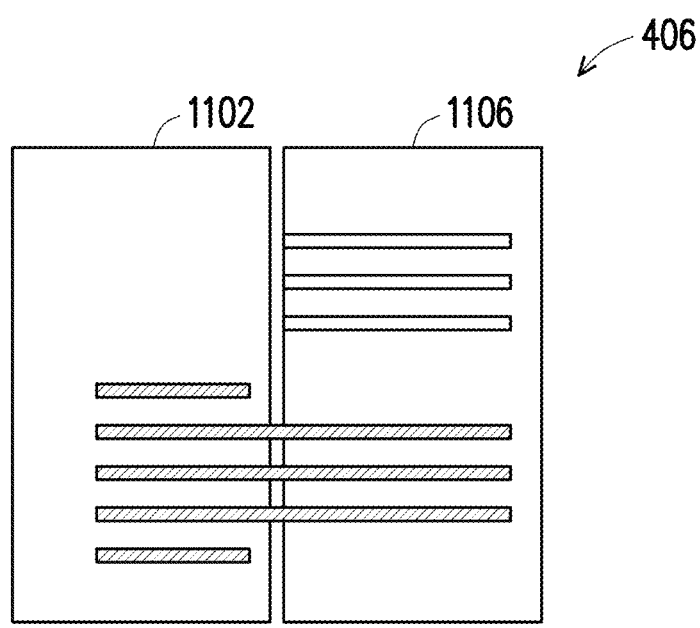

In example embodiments, a length of metal stripes forming second capacitor C2 406 may be varied based on a length of a word line of cell array 112. For example, the length of the metal stripes forming second metal capacitor C2 406 may be varied up to approximately equal to a length of the word line of cell array 112. In some example, the length of the metal stripes of first set of metal stripes 702, 802, and 902 or second set of metal stripes 704, 804, and 904 forming second metal capacitor C2 406 may extended approximately equal to a length of the word line of cell array 112. The lengths of the metal stripes may be varied to vary the capacitance value as well as an amount of power spent for the write operations FIGS. 11A and 11B illustrates different lengths for the metal stripes forming second metal capacitor C2 206 in accordance with some embodiments. As illustrated in FIGS. 11A and 11B, length of the metal stripes may include a base length 1102 and extended lengths 1104 and 1106. Extended lengths 1104 and 1106 may be equal to a length of a word line of cell array 112. For example, and as illustrated in FIGS. 11A and 11B, extended length 1104 of FIG. 11A which is associated with a longer word line is longer than extended length of FIG. 11B which is associated with a shorter bit line.

In example embodiments, both bit line boost circuit 102 and word line boost circuit 402 may be used together in device 100. For example, bit line boost circuit 102 can be used to boost negative voltage of the bit line and word line boost circuit 402 may be used to substantially simultaneously boost the voltage of the word line of cell array 112.

In accordance with example embodiments, a write assist circuit comprises: a transistor switch coupled between a bit line voltage node of a cell array and a ground node; an invertor operative to receive a boost signal responsive to a write enable signal, wherein an output of the invertor is coupled to a gate of the transistor switch; and a metal capacitor having a first end coupled to the bit line voltage node and a second end coupled to the gate of the transistor switch, wherein the metal capacitor is operative to drive a bit line voltage of the bit line voltage node to a negative value from the ground voltage in response to the boost signal.

In example embodiments, a write assist circuit comprises: a first transistor switch connected between a word line voltage node and a supply voltage, wherein a gate of the first transistor switch is operative to receive a boost signal responsive to a write enable signal; a second transistor switch connected between the word line voltage node and the supply voltage, wherein a gate of the second transistor switch is coupled to the word line voltage node; and a metal capacitor having a first end coupled to the word line voltage node and a second end operative to receive the boost signal, wherein the metal capacitor is operative to drive a word line voltage of the word line voltage node to a boosted value from the supply voltage in response to the boost signal.

In accordance with example embodiments a method of negatively boosting a bit line voltage for writing data to a memory cell, the method comprises: connecting, during a write enable period, a bit line voltage node to the ground through a first transistor switch; turning, responsive to a boost signal, the first transistor switch off to disconnect the bit line voltage node from the ground; initiating, after the first transistor switch is turned off, charging of a first metal capacitor having a first end coupled to the bit line voltage node and a second end coupled to the gate of the first transistor switch, wherein charging of the first metal capacitor drives the bit line voltage node to a first negative voltage; and turning, after the end of the write enabled period, on the first transistor switch to reconnect the bit line voltage node to the ground.

In example embodiments, a method of boosting a word line voltage for writing data to a memory cell, the method comprises: disconnecting, at a start of a write enable period, a word line voltage node from a supply node through a second transistor switch; turning, responsive to a boost signal, off the first transistor switch off disconnect the word line voltage node from the supply voltage; initiating, after the second transistor switch is turned off, charging of a second metal capacitor having a first end coupled to the word line voltage node and a second end coupled to a gate of the second transistor switch, wherein charging of the second metal capacitor drives the word line voltage node to a boosted voltage, the boosted voltage being higher than the supply voltage; and turning, after the end of the write enabled period, on the second transistor switch to reconnect the word line voltage node to the supply voltage.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A write assist circuit, comprising:
a first transistor switch coupled between a bit line voltage node of a cell array and a ground node;
a first metal capacitor comprising a first plurality of metal stripes substantially parallel to each other and a second plurality of metal stripes substantially parallel to each other, wherein the first plurality of metal stripes are coupled to the bit line voltage node which in turn is connected to a selected bit line, wherein the second plurality of metal stripes are coupled to a gate of the first transistor switch, and wherein the first metal capacitor is operative to drive a bit line voltage of the bit line voltage node to a negative value from the ground voltage in response to a boost signal;
a second transistor switch connected between a word line voltage node and a supply voltage, wherein a gate of the second transistor switch is operative to receive the boost signal responsive to a write enable signal;
a third transistor switch connected between the word line voltage node and the supply voltage, wherein a gate of the third transistor switch is coupled to the word line voltage node; and
a second metal capacitor having a first end coupled to the word line voltage node and a second end operative to receive the boost signal, wherein the second metal capacitor is operative to drive a word line voltage of the word line voltage node to a boosted value from the supply voltage in response to the boost signal.

2. The write assist circuit of claim 1, further comprising a first metal oxide semiconductor capacitor connected in parallel to the first metal capacitor.

3. The write assist circuit of claim 1, further comprising a second metal oxide semiconductor capacitor connected in parallel to the second metal capacitor.

4. The write assist circuit of claim 1, wherein a length of at least one of the first plurality of metal stripes and the second plurality of metal stripes comprises a base length and an extended length, wherein the extended length is less than or equal to a word line length of a cell array.

5. The write assist circuit of claim 1, wherein the first plurality of metal stripes are in a first metal layer and the second plurality of metal stripes are formed in a second metal layer, the second metal layer being different from the first metal layer.

6. The write assist circuit of claim 1, wherein the first metal capacitor comprises a first sub-capacitor and a second sub-capacitor, wherein the first sub-capacitor is connected in parallel to the second sub-capacitor.

7. The write assist circuit of claim 1, wherein the first metal capacitor comprises hand clasping metal capacitor.

8. The write assist circuit of claim 1, wherein the first metal capacitor comprises a grid style metal capacitor.

9. The write assist circuit of claim 1, wherein the first metal capacitor comprises a via style metal capacitor.

10. A method comprising:
connecting a bit line voltage node to the ground through a first transistor switch;
turning, responsive to a boost signal, off the first transistor switch to disconnect the bit line voltage node from the ground;
initiating, after the first transistor switch is turned off, charging of a first metal capacitor comprising a first plurality of metal stripes substantially parallel to each other and a second plurality of metal stripes substantially parallel to each other, wherein the first plurality of metal stripes are coupled to the bit line voltage node which in turn is connected to a selected bit line of a memory device and the second plurality of metal stripes are coupled to a gate node of the first transistor switch, and wherein charging the first metal capacitor drives the bit line voltage node to a negative voltage;
providing a second transistor switch connected between a word line voltage node and a supply voltage, wherein a gate of the second transistor switch is operative to receive the boost signal responsive to a write enable signal;
providing a third transistor switch connected between the word line voltage node and the supply voltage, wherein a gate of the third transistor switch is coupled to the word line voltage node; and
providing a second metal capacitor having a first end coupled to the word line voltage node and a second end operative to receive the boost signal, wherein the second metal capacitor is operative to drive a word line voltage of the word line voltage node to a boosted value from the supply voltage in response to the boost signal.

11. A method of claim 10, wherein a first metal oxide semiconductor capacitor connected in parallel to the first metal capacitor.

12. A method of claim 10, a second metal oxide semiconductor capacitor connected in parallel to the second metal capacitor.

13. A method of claim 10, wherein a length of at least one of the first plurality of metal stripes and the second plurality of metal stripes comprises a base length and an extended length, wherein the extended length is less than or equal to a word line length of a cell array.

14. A method of claim 10, wherein the first plurality of metal stripes are in a first metal layer and the second plurality of metal stripes are formed in a second metal layer, the second metal layer being different from the first metal layer.

15. A method of claim 10, wherein the first metal capacitor comprises a first sub-capacitor and a second sub-capacitor, wherein the first sub-capacitor is connected in parallel to the second sub-capacitor.

16. A method of claim 10, the first metal capacitor comprises hand clasping metal capacitor.

17. A method of claim 10, wherein the first metal capacitor comprises a grid style metal capacitor.

18. The method of claim 10, wherein the first metal capacitor comprises a via style metal capacitor.

19. The method of claim 10, wherein a metal oxide semiconductor capacitor is connected in parallel to the first metal capacitor.

20. A write assist circuit, comprising:
a first transistor switch coupled between a bit line voltage node of a cell array and a ground node;
a first metal capacitor comprising a first plurality of metal stripes substantially parallel to each other and a second plurality of metal stripes substantially parallel to each other, wherein the first plurality of metal stripes are coupled to the bit line voltage node which in turn is connected to a selected bit line, wherein the second plurality of metal stripes are coupled to a gate of the first transistor switch, and wherein the first metal capacitor is operative to drive a bit line voltage of the bit line voltage node to a negative value from the ground voltage in response to a boost signal;

a second transistor switch connected between a word line voltage node and a supply voltage, wherein a gate of the second transistor switch is operative to receive the boost signal responsive to a write enable signal;

a third transistor switch connected between the word line voltage node and the supply voltage, wherein a gate of the third transistor switch is coupled to the word line voltage node; and a second metal capacitor having a first end coupled to the word line voltage node and a second end operative to receive the boost signal, wherein the second metal capacitor is operative to drive a word line voltage of the word line voltage node to a boosted value from the supply voltage in response to the boost signal, and wherein a metal oxide semiconductor capacitor is connected in parallel to the first metal capacitor.

* * * * *